(12) United States Patent
Johansson et al.

(10) Patent No.: US 7,618,865 B2
(45) Date of Patent: Nov. 17, 2009

(54) METHOD IN THE FABRICATION OF A MONOLITHICALLY INTEGRATED VERTICAL DEVICE ON AN SOI SUBSTRATE

(75) Inventors: Ted Johansson, Djursholm (SE); Hans Norstroem, Solna (SE)

(73) Assignee: Infineon Technologies AG, Munich (DE)

( * ) Notice: Subject to any disclaimer, the term of this patent is extended or adjusted under 35 U.S.C. 154(b) by 386 days.

(21) Appl. No.: 11/217,105

(22) Filed: Aug. 31, 2005

(65) Prior Publication Data
US 2007/0048928 A1    Mar. 1, 2007

(30) Foreign Application Priority Data
Aug. 31, 2004   (EP) .................................. 04020674

(51) Int. Cl.
*H01L 21/336* (2006.01)
(52) U.S. Cl. ................... 438/269; 438/149; 438/156; 438/212; 438/479; 257/347; 257/E21.561; 257/E21.562
(58) Field of Classification Search ................. 438/234, 438/311, 269, 137, 138, 149, 156, 192, 212, 438/479; 257/347, E21.375, E21.561, E21.562
See application file for complete search history.

(56) References Cited

U.S. PATENT DOCUMENTS

| | | | |
|---|---|---|---|
| 4,507,158 A * | 3/1985 | Kamins et al. ............... 438/413 |
| 4,575,925 A * | 3/1986 | Kanbara et al. ............. 438/413 |
| 5,087,580 A | 2/1992 | Eklund | |
| 5,143,862 A * | 9/1992 | Moslehi ...................... 438/413 |
| 5,234,861 A * | 8/1993 | Roisen et al. ............... 438/407 |
| 5,904,535 A | 5/1999 | Lee | |
| 6,124,181 A | 9/2000 | Ueda | |
| 6,180,486 B1 * | 1/2001 | Leobandung et al. ........ 438/405 |
| 6,232,649 B1 | 5/2001 | Lee | |
| 6,235,567 B1 * | 5/2001 | Huang ......................... 438/202 |

(Continued)

FOREIGN PATENT DOCUMENTS

CN    1230771 A    10/1999

(Continued)

OTHER PUBLICATIONS

Burghartz et al., "A Low-Capacitance Bipolar/BiCMOS Isolation Technology, Part 1—Concept, Fabrication Process, and Characterization", IEEE Transactions on Electron Devices, vol. 41, No. 8, Aug. 1994, pp. 1379-1387, (9 pages).

(Continued)

*Primary Examiner*—Matthew C Landau
*Assistant Examiner*—Colleen E Snow
(74) *Attorney, Agent, or Firm*—Maginot, Moore & Beck (57) ABSTRACT

A method in the fabrication of a monolithically integrated vertical device on an SOI substrate comprises the steps of providing an SOI substrate including, from bottom to top, a silicon bulk material, an insulating layer, and an monocrystalline silicon layer; forming an opening in the substrate, which extends into the bulk-material, forming silicon oxide on exposed silicon surfaces in the opening and subsequently removing the formed oxide, whereby steps in the opening are formed; forming a region of epitaxial silicon in the opening; and forming a deep trench in an area around the opening, whereby the steps in the opening are removed.

21 Claims, 10 Drawing Sheets

U.S. PATENT DOCUMENTS

| | | | |
|---|---|---|---|
| 6,365,447 B1 * | 4/2002 | Hebert et al. | 438/203 |
| 6,404,014 B1 | 6/2002 | Leobandung et al. | |
| 6,482,710 B2 * | 11/2002 | Oda et al. | 438/311 |
| 6,501,152 B1 * | 12/2002 | Johnson | 257/558 |
| 6,506,656 B2 * | 1/2003 | Freeman et al. | 438/309 |
| 6,570,240 B1 * | 5/2003 | Ohyanagi et al. | 257/575 |
| 6,610,578 B2 * | 8/2003 | Norstrom et al. | 438/369 |
| 6,773,973 B2 * | 8/2004 | Kalnitsky et al. | 438/189 |
| 7,187,035 B2 * | 3/2007 | Nagano et al. | 257/347 |
| 2002/0053705 A1 * | 5/2002 | Kondo et al. | 257/368 |
| 2003/0057487 A1 * | 3/2003 | Yamada et al. | 257/347 |
| 2005/0272230 A1 * | 12/2005 | Williams et al. | 438/510 |
| 2006/0270144 A1 * | 11/2006 | Huang | 438/238 |
| 2008/0315361 A1 * | 12/2008 | Hurkx et al. | 257/586 |

FOREIGN PATENT DOCUMENTS

| | | | |
|---|---|---|---|
| EP | 1 220 312 A1 | 7/2002 | |
| EP | 1220312 A1 * | 7/2002 | |
| WO | WO 99/31515 | 6/1999 | |
| WO | WO 02/091463 A1 | 11/2002 | |

OTHER PUBLICATIONS

Tsaur et al., "Merged CMOS/Bipolar Technologies and Microwave MESFETs Utilizing Zone-Melting-Recrystallized SOI Films", IEDM Tech. Dig., 1984, pp. 812-815, (4 pages).

Cai et al., "Vertical SiGe-Base Bipolar Transistors on CMOS-Compatible SOI Substrate", Proceedings of the 2003 Bipolar/BiCMOS Circuits and Technology Meeting, 2003, (4 pages).

Terada et al., "A New DRAM Cell with a Transistor on a Lateral Epitaxial Silicon Layer (TOLE Cell)", IEEE Transactions on Electron Devices, vol. 37, No. 9, Sep. 1999, pp. 2052-2057, (6 pages).

* cited by examiner

METHOD IN THE FABRICATION OF A MONOLITHICALLY INTEGRATED VERTICAL DEVICE ON AN SOI SUBSTRATE

CROSS-REFERENCE TO RELATED APPLICATIONS

This application claims priority from European Patent Application No. 04020674.0, which was filed on Aug. 31, 2004, and is incorporated herein by reference in its entirety.

BACKGROUND OF THE INVENTION

1. Field of the Invention

The present invention generally relates to the field of integrated circuit technology, and more specifically the invention relates to a method in the fabrication of a monolithically integrated vertical device on an SOI (silicon-on-insulator) substrate.

2. Description of the Related Art

CMOS SOI technology, especially using thin silicon top layers to allow them to be partially depleted (PD) or fully depleted (FD) already at very low bias voltages, is believed to become a key contributor to the continued increase of circuit performance. The thin silicon top layers have a thickness of less than about 200 nm.

All main IC manufacturers today are evaluating CMOS-SOI for process generations capable of producing features of sizes less than 100 nm. Some of these manufacturers focus their production on PD SOI using commercially available SOI wafers, and all of them are evaluating the potential of FD SOI for low-power digital, mixed and RF applications. SOI technology today is mainly applied in the field of high-speed processor technology. Processors are now produced based on 90 nm CMOS PD SOI with speeds up to 2.5 GHz, corresponding to a speed gain of about 20-25%.

It is well known how to modify CMOS devices for PD or FD SOI. However, to adopt an RF BiCMOS process for PD or FD SOI is a much more complex task since there is no simple way of forming bipolar devices in the thin SOI silicon top layer with similar performance as when vertical NPN transistors are formed in a bulk material.

There are two known main approaches for integrating bipolar devices into a CMOS SOI process.

According to the first main approach no modifications of the SOI starting material are made. Instead, the device is formed in the existing material, see e.g. U.S. Pat. No. 5,087,580 to Eklund. The concept is, however, not possible to extend to thin silicon top layers, such as those needed by modern high-performance SOI processes. Tsaur et al., p. 812 in IEDM Tech. Dig. 1984 disclose the use of a very thick starting top silicon layer, which is made thinner where the MOS devices are to be formed. J. Cai et al., Vertical SiGe-Base Bipolar Transistors on CMOS-Compatible SOI Substrate, p. 215 in Proceedings of the 2003 Bipolar/BiCMOS Circuits and Technology Meeting, disclose an epitaxial-base transistor structure to gain some margin in the thickness requirements, and the thin silicon top layer of the starting material is entirely used for the collector of the bipolar transistor.

According to the second main approach the buried SOI substrate oxide is removed locally, at which areas local bulk regions are formed. Tsaur et al. show in the above paper (FIG. 1b) also this approach, using selective epitaxial growth (SEG) to create the islands for the bipolar devices. In U.S. Pat. No. 4,575,925 to Kanbara et al. methods to create isolated, rather deep, silicon "islands", which are used to form conventional diffused bipolar transistors, are disclosed. U.S. Pat. Nos. 5,904,535 and 6,232,649 to Lee show structures and methods similar to those disclosed by Tsaur et al., but which are modified to modern substrate and process technology, and which are extended to include oxide spacers at the edge of the bulk islands in order to improve the device isolation. Terada et al., IEEE Transactions on Electron Devices, p. 2052, September 1990, and Burghartz et al. in IEEE Transactions on Electron Devices, p. 1379, August 1994 Selective epitaxial growth (SEG) disclose the formation of rather complex isolated structures using selective epitaxial growth (SEG). Additional lateral extensions are created by severe SEG overgrowth and additional polycrystalline silicon deposition, and the planarization is achieved by polishing.

The device structures must be able to scale to very thin silicon layer thickness, therefore only the second main approach can be considered as viable. The technique using a very thick starting top silicon layer, which is made thinner where the MOS devices are to be formed as disclosed by Tsaur et al. requires high quality silicon etch to make the silicon layer thinner in the regions used for MOS devices. When the layer thickness is made very thin this approach is not preferred because of the precision and variation over the wafer in silicon etch rate.

The second approach disclosed by Tsaur et al. lacks isolation of the buried collector "islands". Also, the difference in height between CMOS areas and bipolar areas may create e.g. focusing problems during the lithography steps, or need for large planarization before the metallization.

The methods described by Kanbara are quite complicated and the dimensions are not fitted to permit integration of the silicon "islands" with thin silicon SOI.

U.S. Pat. Nos. 5,904,535 and 6,232,649 disclose structures and methods which are far from optimal with regards to the complicated formation of the spacers used for the device isolation. Furthermore, the spacers create large walls, or steps, at the surface around the silicon islands, which requires good planarization for the interconnections between the bipolar transistors and the rest of the circuit.

SUMMARY OF THE INVENTION

Accordingly, it is an object of the present invention to provide a method in the fabrication of a monolithically integrated vertical device, particularly bipolar transistor, which overcomes the problems associated with the prior art described above.

It is a further object of the invention to provide such a method, which provides for simple and straight-forward fabrication of the vertical device with a minimum of process steps.

It is yet a further object of the invention to provide such a method, by which good device isolation is obtained.

It is still a further object of the invention to provide such a method, by which the vertical device can be formed in level with CMOS SOI devices.

In accordance with a first aspect, the present invention provides a method in the fabrication of a monolithically integrated vertical device on an SOI substrate, having the steps of: providing an SOI substrate having, from bottom to top, a silicon bulk material, an insulating layer, and a monocrystalline silicon layer, forming, for the vertical device, an opening in the SOI substrate, the opening extending into the silicon bulk material, forming silicon oxide on exposed silicon surfaces in the opening and subsequently removing the formed silicon oxide, whereby steps in the SOI substrate in the opening are formed, forming a region of epitaxial silicon in the opening, forming a deep trench in an area around the opening, whereby the steps in the SOI substrate in the opening are removed.

According to a first aspect of the present invention, there is thus provided a method in the fabrication of a monolithically integrated vertical device on an SOI substrate. The method comprises the steps of providing an SOI substrate including, from bottom to top, a silicon bulk material, an insulating layer, and a monocrystalline silicon layer; forming an opening in the substrate, which extends into the bulk material, forming silicon oxide on exposed silicon surfaces in the opening and subsequently removing the formed oxide, whereby steps in the opening are formed; forming a region of silicon in the opening; and forming a deep trench in an area around the opening, whereby the steps in the opening are removed.

The vertical device may e.g. be a vertical bipolar transistor or a vertical capacitor.

Preferably, a buried doped region is formed in the silicon bulk material at the bottom of the opening prior to the formation of the region of silicon in the opening. The buried doped region may be formed by means of ion implantation followed by a drive-in stage including at least one heat treatment performed at least partly when the formed silicon oxide covers the exposed silicon surfaces.

If the vertical device is a vertical bipolar transistor, the buried doped region will be a buried subcollector of the transistor, and if the vertical device is a capacitor, the buried doped region will be a lower electrode of the capacitor.

Further characteristics of the invention and advantages thereof will be evident from the detailed description of preferred embodiments of the present invention given hereinafter and the accompanying FIGS. 1-20, which are given by way of illustration only, and are thus not limitative of the present invention.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

A preferred embodiment of a method in the fabrication of a monolithically integrated vertical device on a commercially available thin-silicon SOI substrate is described below with reference to FIGS. 1-20. The method is preferably implemented in a BiCMOS process, but may optionally be implemented in a pure CMOS process.

Figure 1:
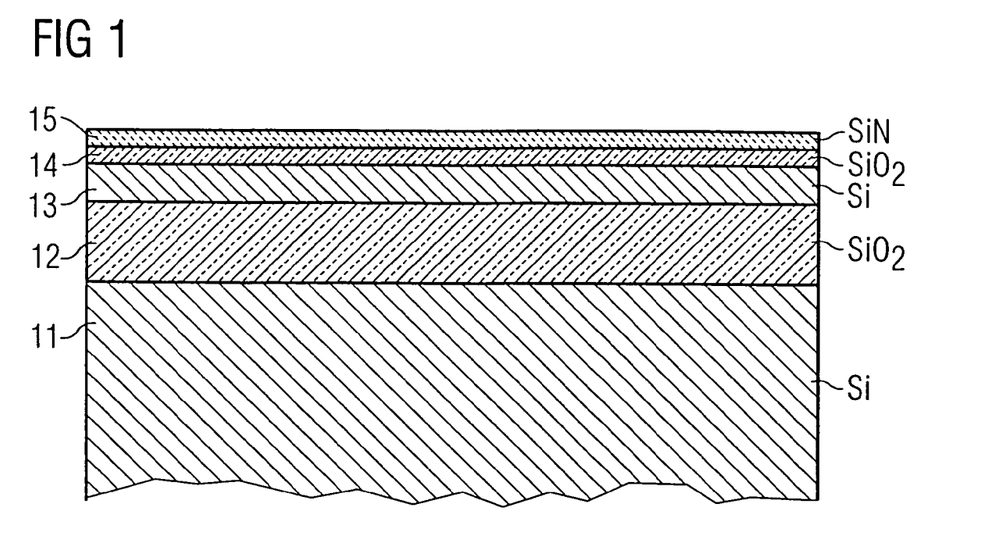
FIGS. 1-20 are highly enlarged cross-sectional views of a portion of a semiconductor structure during processing according to a preferred embodiment of the present invention.

A semiconductor structure including an SOI substrate is shown in FIG. 1 in a cross section. The SOI substrate includes from bottom to top a silicon wafer 11, an insulating layer 12 of silicon oxide, and a doped monocrystalline layer 13 of silicon. A further layer 14 of silicon oxide and a layer 15 of silicon nitride are formed on top of the SOI substrate.

As a non-limiting example the SOI silicon bulk material of the wafer 11 may have a resistivity of above about 1000 $\Omega$cm, the SOI silicon oxide layer 12 may 400 nm thick, the SOI monocrystalline layer 13 may consist of 200 nm thick <100> silicon with a resistivity of about 10 $\Omega$cm, the upper silicon oxide layer 14 may be an about 10 nm thick thermal oxide, and the silicon nitride layer 15 may be deposited to a thickness of about 50 nm. Preferably, the SOI monocrystalline layer 13 is less than about 200 nm to allow for the fabrication of partly or fully depleted MOS devices therein.

Figure 2:
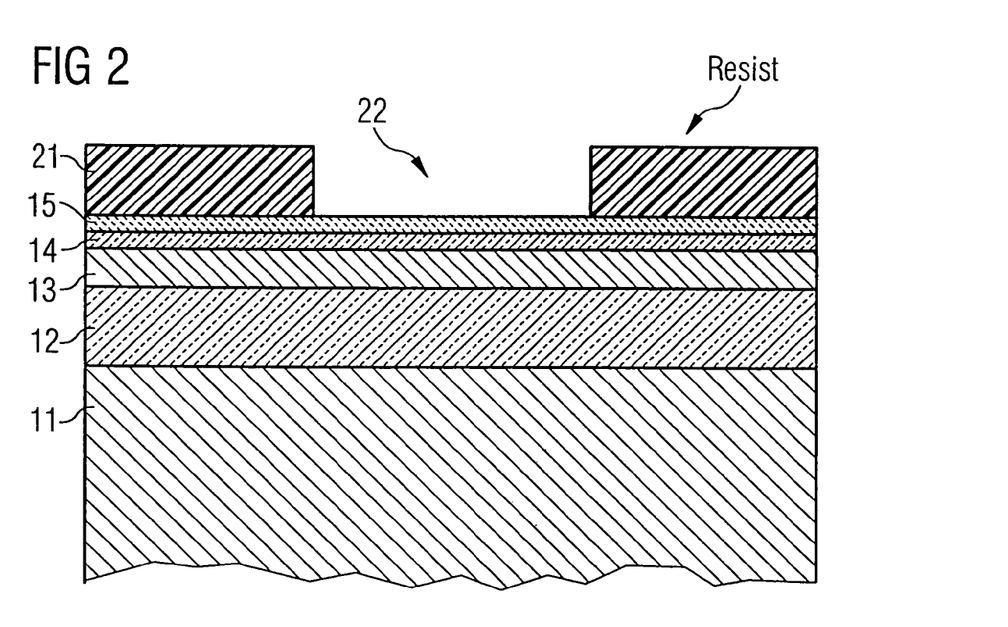

A photo resist layer 21 is then applied on the semiconductor structure and is patterned so that an opening 22 is formed where the vertical device is to be formed. The resulting structure is shown in FIG. 2.

Figure 3:
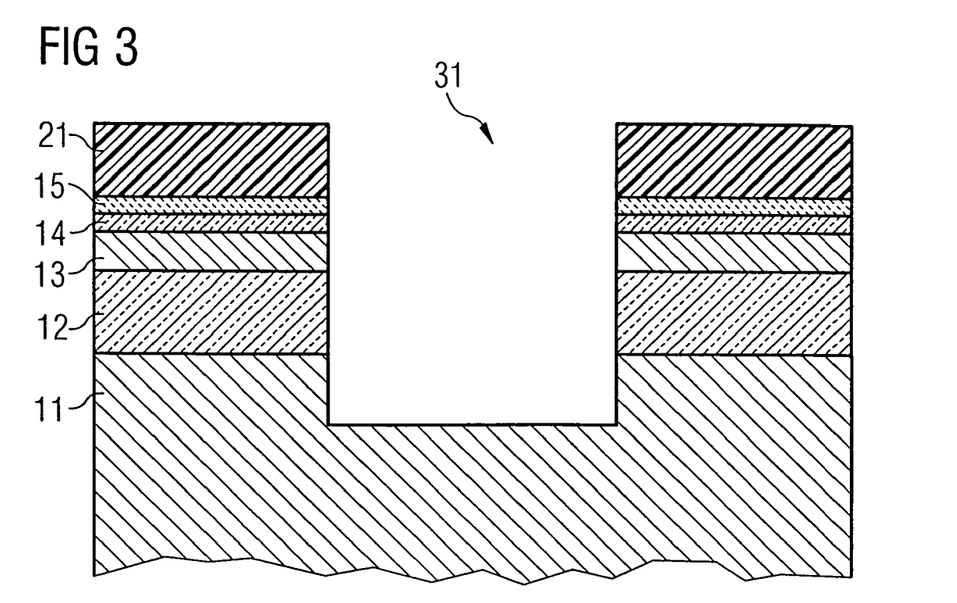

Next, the structure is etched using the patterned photo resist layer 21 as mask. An opening 31 is thereby formed in the silicon nitride layer 15, the upper silicon oxide layer 14, the SOI monocrystalline silicon layer 13, the SOI silicon oxide layer 12, and the SOI silicon wafer 11. The resulting structure is shown in FIG. 3.

Figure 4:
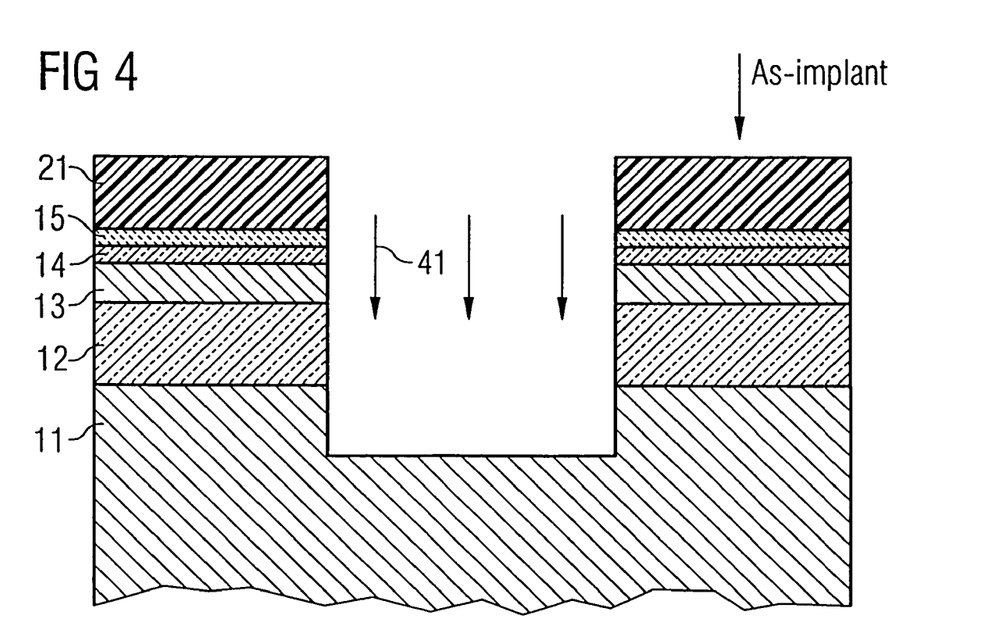

An ion implantation, schematically illustrated by arrows 41 in FIG. 4, for a subcollector or buried doped region is then performed, with the patterned photo resist layer 21 still present on the structure to protect the other areas of the structure from the implant. Typically, arsenic is implanted e.g. using an energy of about 50 keV and a dose of about $5*10^{15}$ cm$^{-2}$.

Figure 5:
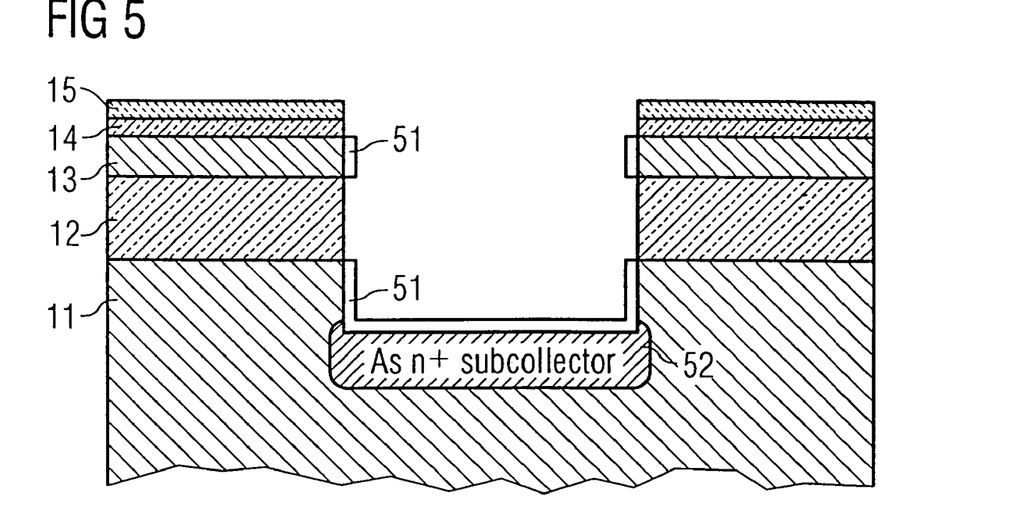

The patterned photo resist layer 21 is removed, and a drive-in heat-treatment process is performed. As a result, a thermal silicon oxide 51 is formed on exposed silicon surfaces, and the implanted species is driven into the SOI silicon wafer 11 to form a subcollector or buried doped region 52 at the bottom of the opening 31. The subcollector region drive-in may be performed according to the details outlined in our published PCT application WO 02/091463 A1, the contents of which being hereby incorporated by reference.

Figure 6:
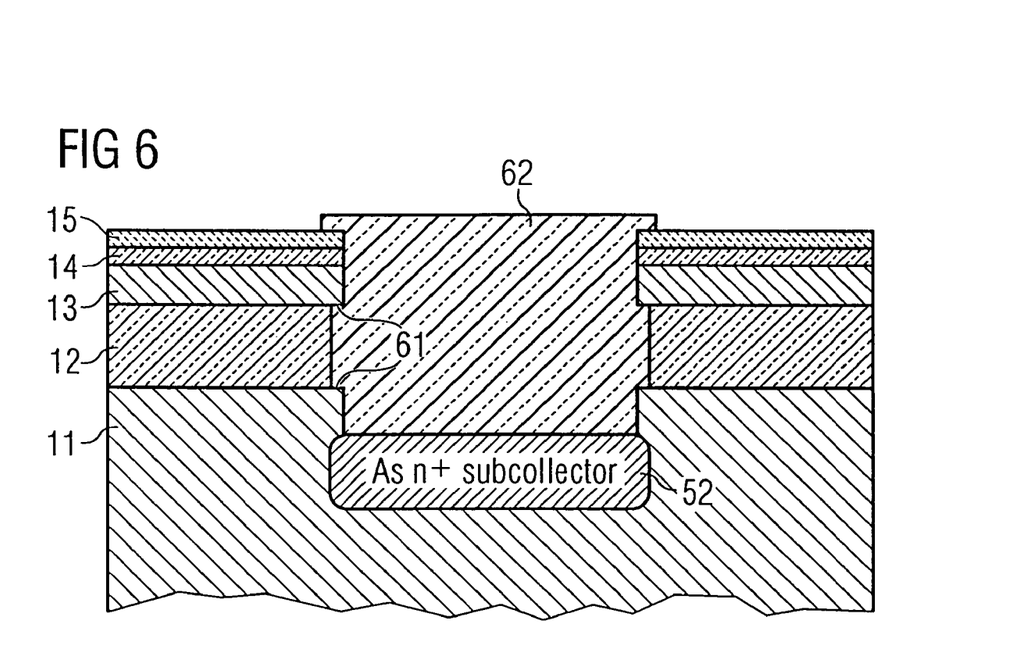

Next, the thermal silicon oxide 51 is removed by etching. As a result, the SOI silicon oxide layer 12 is etched and steps 61 in the SOI substrate are formed. Silicon is preferably epitaxially grown to form a silicon region 62 in the etched opening. Preferably, a slight overgrowth is made. The resulting structure is shown in FIG. 6.

Figure 7:
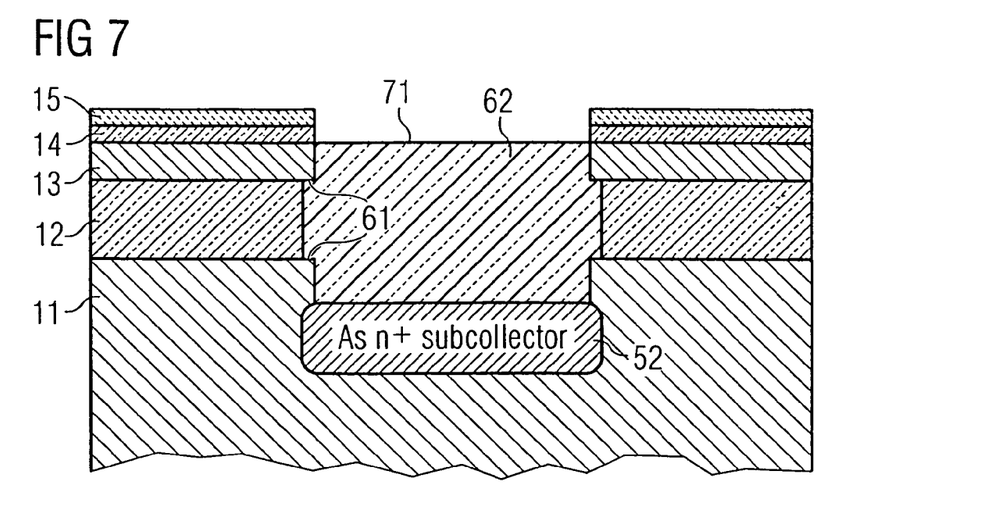

The overgrown silicon region 62, and any other silicon deposited on nitride areas (not illustrated), is removed using chemical-mechanical polishing (CMP) to obtain a planar upper surface 71 of the silicon region 62. Preferably, the silicon region 62 is polished so that its upper surface 71 is in level with the upper surface of the SOI monocrystalline layer 13, as can be seen in FIG. 7.

Figure 8:
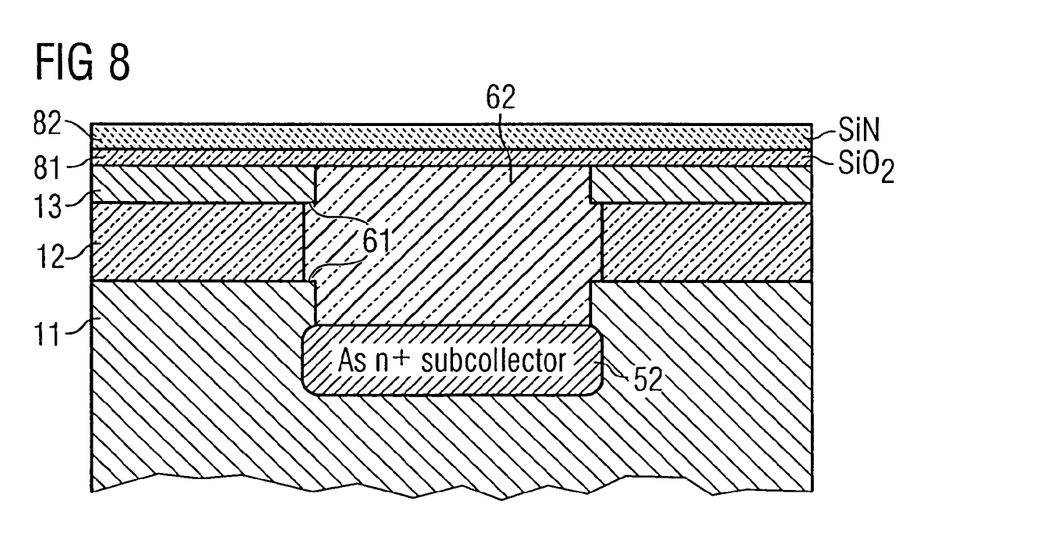

The initially formed silicon oxide layer 14 and silicon nitride layer 15 are removed, and a new oxide/nitride bi-layer 81, 82 for the forthcoming formation of shallow trench isolation is formed. This may be performed according to the details found in the above-identified WO 02/091463 A1. The resulting structure is seen in FIG. 8.

Figure 9:
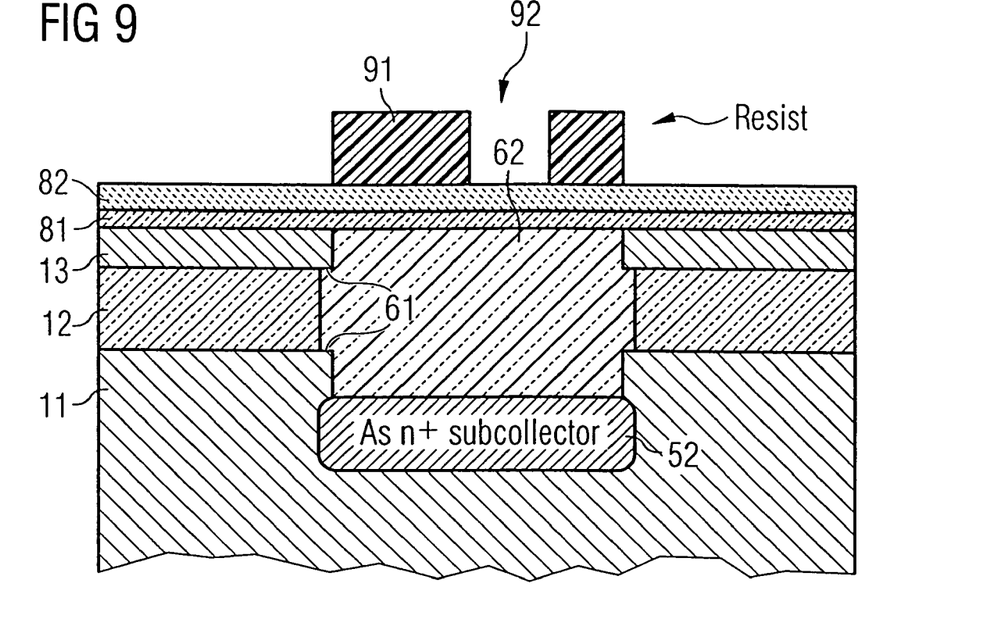

Another photo resist layer 91 is then applied on the semiconductor structure and is patterned so that it covers the area where the vertical device is formed except at 92 where a shallow isolation within the vertical device is to be formed. The resulting structure is shown in FIG. 9.

Figure 10:
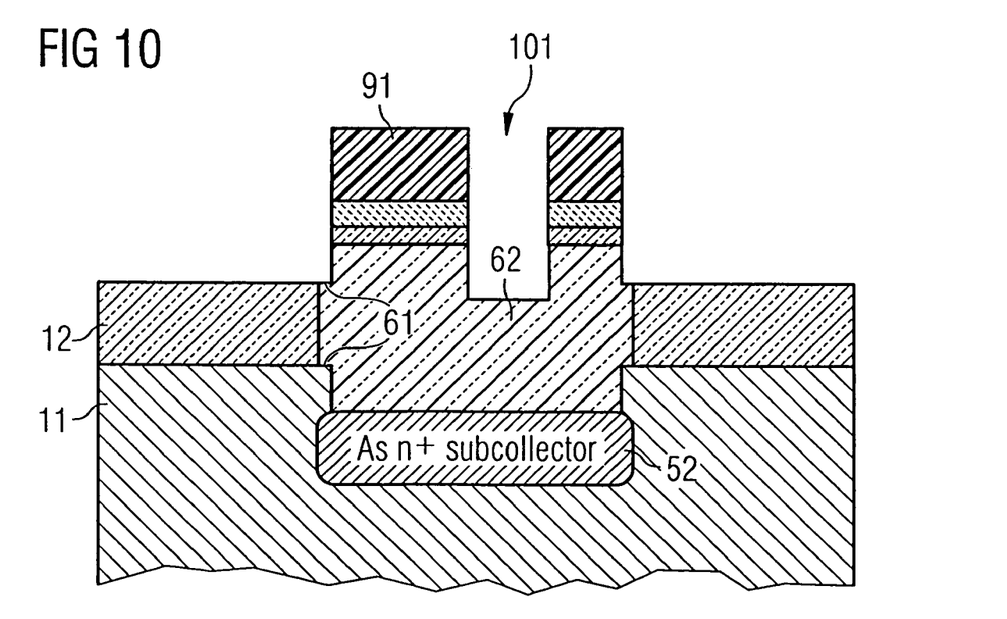

The structure is subsequently etched using the patterned photo resist layer 91 as mask and the SOI silicon oxide layer 12 as etch stop. In the opening 92, where the shallow isolation within the vertical device is to be formed, the bi-layer 81, 82 and the silicon region 62 are etched to form an opening 101 extending into the silicon region 62. Since no etch stop exists here, the etch will continue a little bit further down in the silicon region 62, i.e. the bottom of the opening 101 will be slightly lower than the upper surface of the SOI silicon oxide layer 12, as can be seen in FIG. 10. The patterned photo resist layer 91 is removed.

Figure 11:
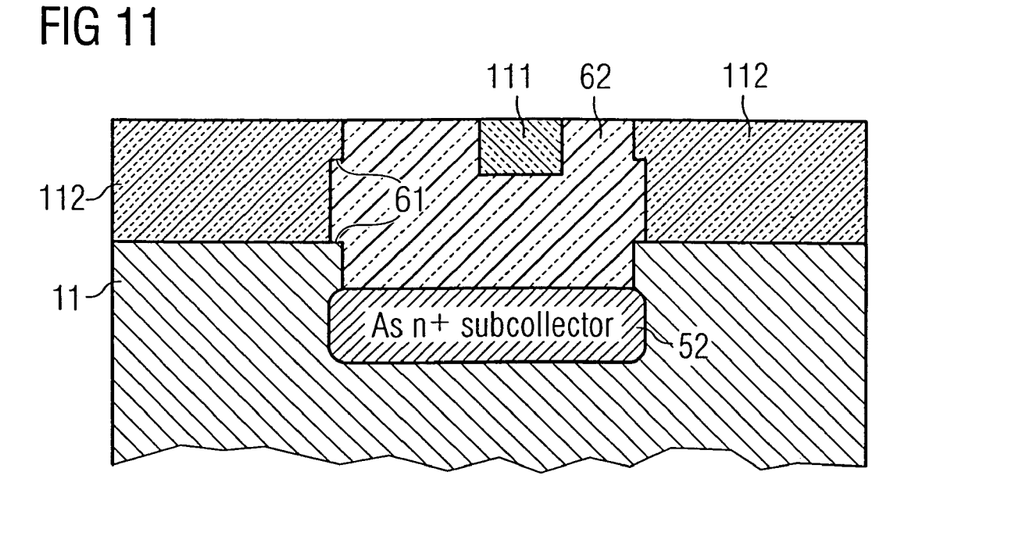

Thick oxide is deposited, and then planarized e.g. by chemically-mechanically polishing, after which the oxide/nitride bi-layer 81, 82 is removed. The thick deposited and planarized oxide forms a shallow isolation region 111 in the silicon region 62, wherein the vertical device is to be fabricated, and, together with the SOI silicon oxide layer 12, a shallow trench isolation region 112 that surrounds the silicon region 62. The resulting structure is shown in FIG. 11.

Figure 12:
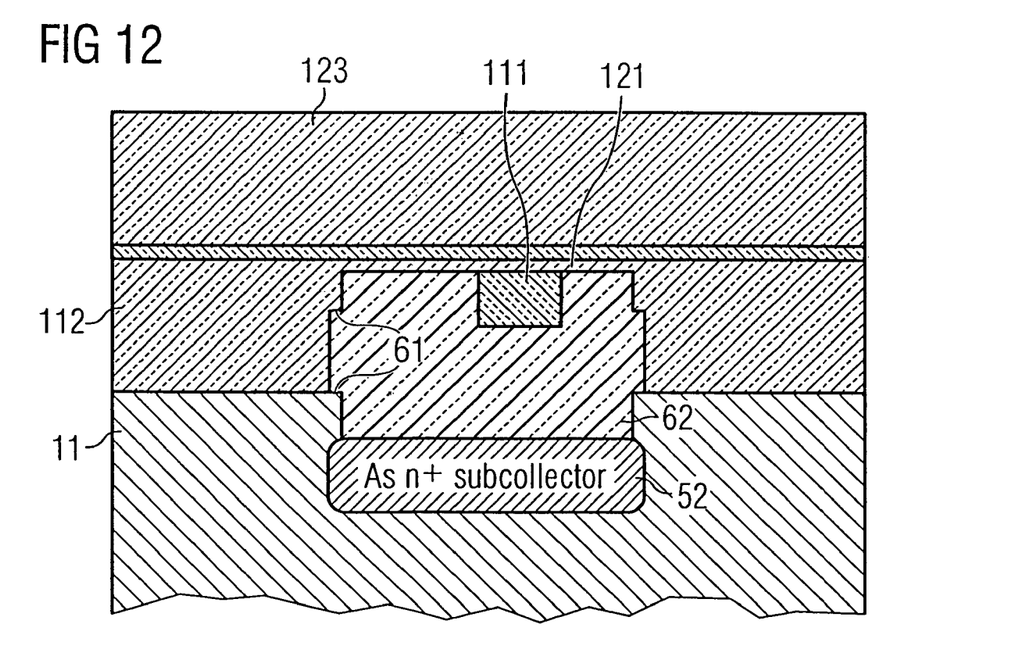

A hard mask for deep trench etching is next formed. The hard mask comprises, from bottom to top, a thin silicon oxide layer 121, a thin polycrystalline silicon layer 122, and a thick silicon oxide layer 123, as can be seen in FIG. 12. The hard mask formation and subsequent etching may be performed according to the details outlined in our published PCT application WO 99/03151, the contents of which being hereby incorporated by reference.

Figure 13:
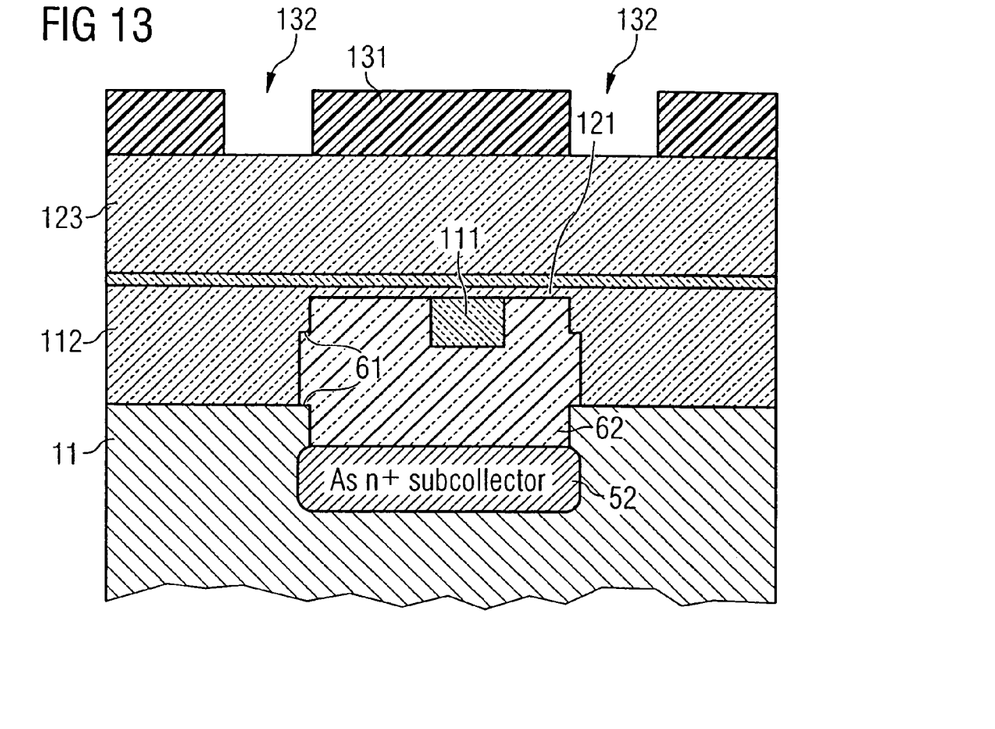
Figure 14:
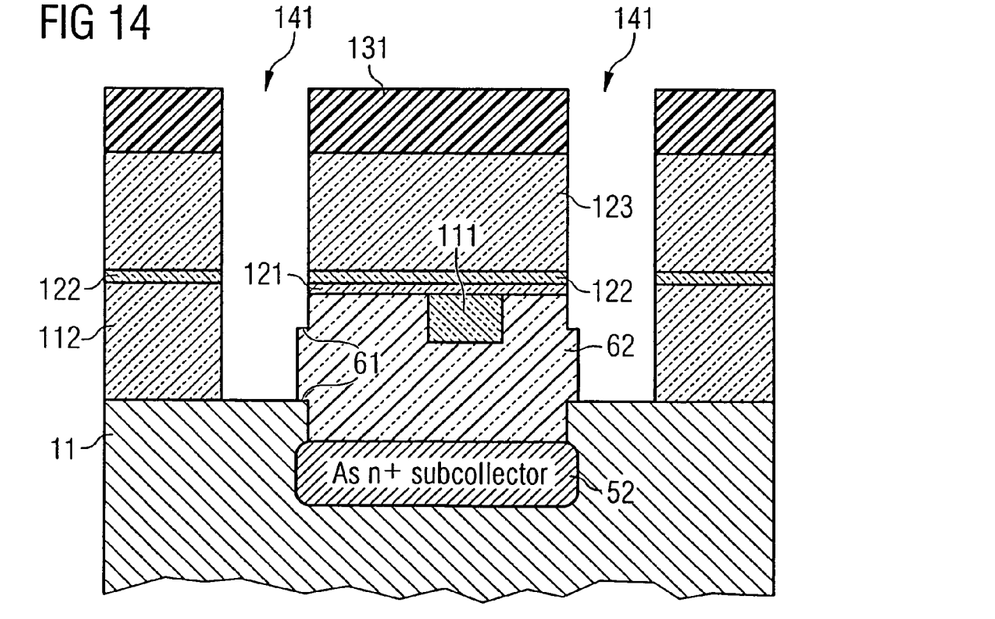
Figure 15:
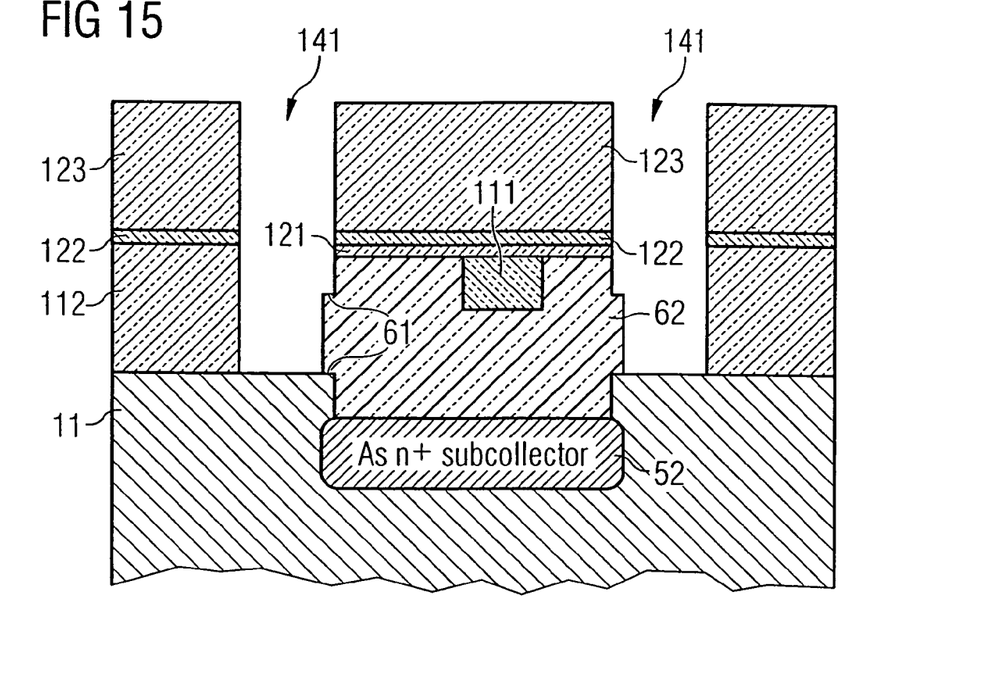

Yet another photo resist layer 131 is then applied on the semiconductor structure and is patterned so that it has an opening 132 where a deep trench surrounding the silicon region 62 is to be formed. The hard mask and the shallow trench isolation region 112 are then etched using the patterned photo resist layer 131 as mask and the SOI silicon bulk material 11 as etch stop, thereby forming an opening 141 in the hard mask and the shallow trench isolation region 112, which surrounds the silicon region 62 and exposes the steps 61 in the SOI substrate. It is here important that the photo resist layer 131 is patterned so that the opening 132 is aligned with the steps 61 in the SOI substrate. FIGS. 13-15 show the semiconductor structure after having-patterned the photo resist layer 131, after having etched the hard mask and the shallow trench isolation region 112, and after having removed the patterned photo resist layer 131, respectively.

Figure 16:
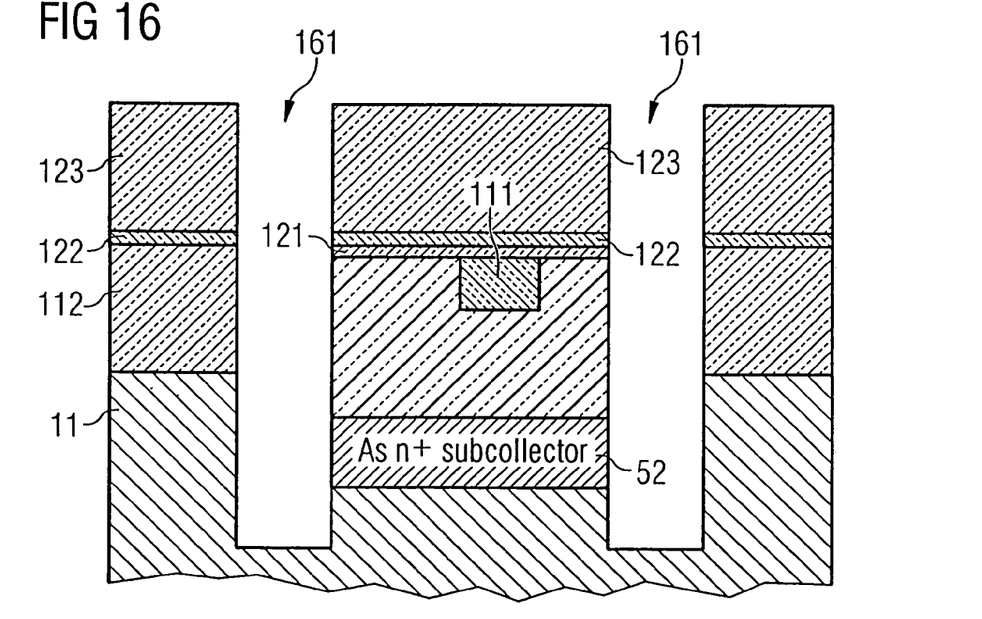
Figure 17:
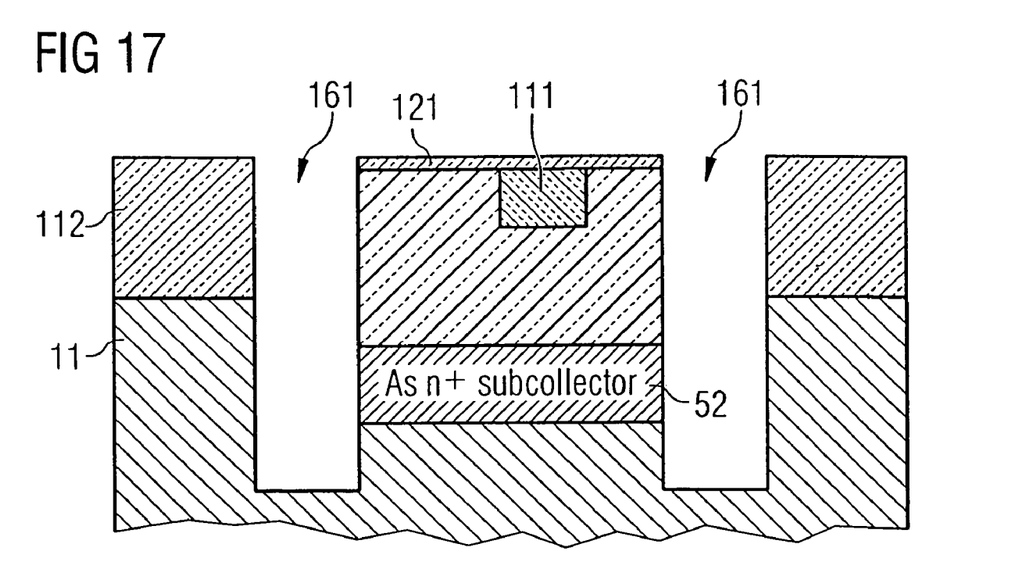

Next, a deep trench is etched using the patterned hard mask as mask, forming a deep trench opening 161, which extends deep into the SOI silicon bulk material 11, and which surrounds the silicon region 62. The thick silicon oxide layer 123, and the thin polycrystalline silicon layer 122 are then etched away. FIGS. 16 and 17 illustrate the structure before and after the etching of the layer 122 and 123. The deep trench opening (161) is preferably etched to a depth of at least a few microns, and more preferably to a depth of at least 5 microns, as measured from the upper surface of the region 62 of epitaxial silicon.

Figure 18:
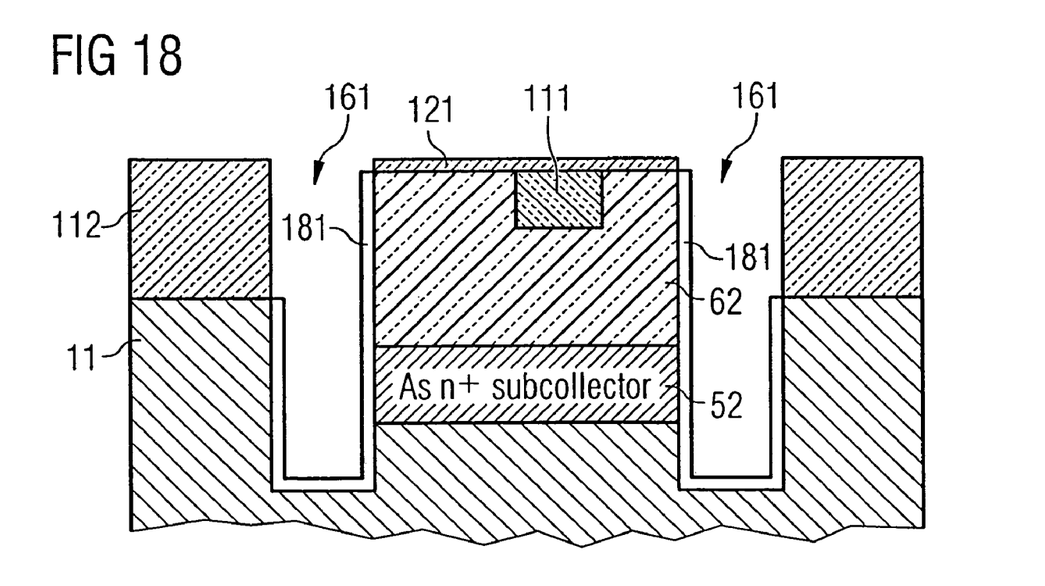

The structure is then thermally oxidized, forming a thin silicon oxide layer in the deep trench opening 161 as can be seen in FIG. 18.

Figure 19:
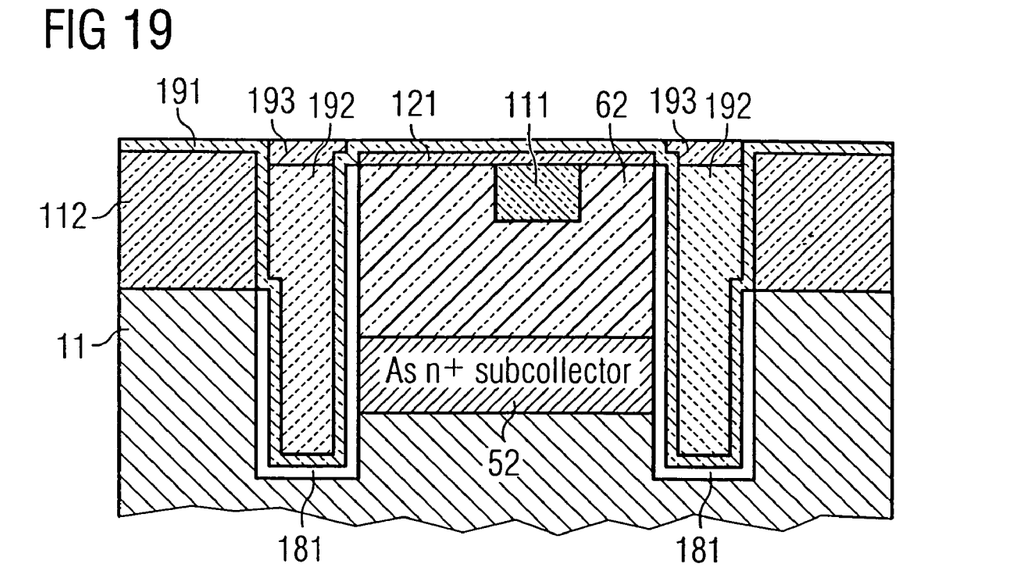

A silicon nitride layer 191 is deposited on the semiconductor structure, and a TEOS layer is deposited thereon (not illustrated), after which the deep trench opening 161 is filled with polycrystalline silicon 192, and etched back to planarize the structure. A deep trench oxidation is performed to create a silicon oxide layer region 193 on top of the polycrystalline silicon 192 in the deep trench opening 161. The resulting structure is illustrated in FIG. 19.

Figure 20:
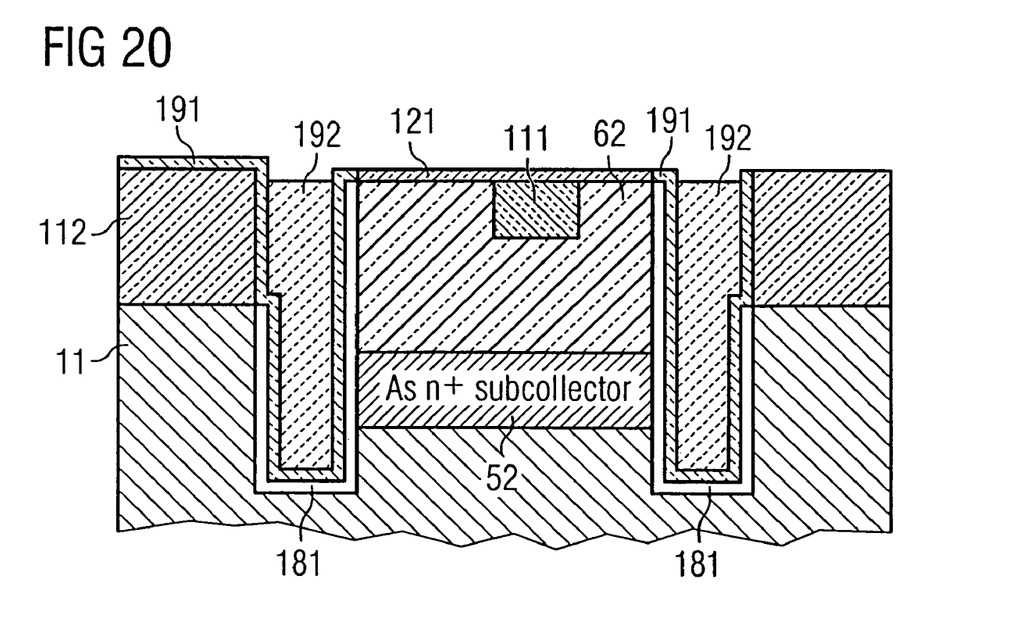

Oxide and nitride on field areas are then removed, i.e. the oxide layer region 193 on top of the polycrystalline silicon 192, and the silicon nitride layer 191 on top of the shallow trench isolation region 112 are removed. The semiconductor structure after the above processing is illustrated in FIG. 20.

The vertical device can now be formed in the silicon region 62 in any manner known to a person skilled in the art. The silicon region 62 is preferably as thick as the SOI silicon layer 13, and is in contact with a subcollector or buried doped region 52 arranged below the silicon region 62. The silicon region 62 and the buried doped region 52 are electrically isolated from other parts of the chip by the deep trench 161, which surrounds the silicon region 62 and the buried doped region 52, and extends deeper into the substrate than the buried doped region 52.

The vertical device may be a vertical bipolar transistor, and in such instance the buried doped region 52 is a buried subcollector of the vertical bipolar transistor.

Alternatively, the vertical device may be a vertical capacitor, and in such instance the buried doped region 52 constitutes a lower electrode of the capacitor.

Yet alternatively, the vertical device may be any kind of device, which needs a connection to the SOI silicon wafer bulk material 11 and/or a silicon depth larger than the thickness of the monocrystalline silicon layer 13 of the SOI substrate. In some instances, the buried doped region 52 and/or the shallow isolation region 111 may not be needed at all.

In the description above, for purposes of explanation and not limitation, specific details are set forth in order to provide a thorough understanding of the present invention. However, it will be apparent to one skilled in the art that the present invention may be practiced in other versions that depart from these specific details. All such modifications as would be obvious to one skilled in the art are intended to be included within the scope of the appended claims.

In other instances, detailed descriptions of well-known methods and measures are omitted so as not to obscure the description of the present invention with unnecessary details. For further process details, reference is made to the above-mentioned published PCT applications WO 02/091463 A1 and WO 99/03151, which, inter alia, disclose details for fabrication of a vertical bipolar transistor or capacitor in the silicon region 62. Note however, that the lateral positioning of the deep trench will be made through photo resist patterning, and will thus not be self-aligned to an edge of the shallow trench, as being disclosed in the former reference.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method in the fabrication of a monolithically integrated vertical device on an SOT substrate, comprising the steps of:
   providing an SOT substrate comprising, from bottom to top, a silicon bulk material, an insulating layer, and a monocrystalline silicon layer,
   forming, for the vertical device, an opening in the SOI substrate, the opening extending into the silicon bulk material,
   forming silicon oxide on exposed silicon surfaces in the opening and subsequently removing the formed silicon oxide, whereby steps in the SOT substrate in the opening are formed,
   forming a vertical device region of epitaxial silicon in the opening,
   forming a deep trench in an area around the opening, whereby the steps in the SOT substrate in the opening are removed, and
   forming the vertical device in the vertical device region.

2. The method of claim 1, wherein a buried doped region is formed in the silicon bulk material at the bottom of the opening prior to the formation of the region of epitaxial silicon in the opening.

3. The method of claim 2, wherein the buried doped region is formed by means of ion implantation followed by a drive-in stage including at least one heat treatment.

4. The method of claim 3, wherein the drive-in stage is performed at least partly when the formed silicon oxide covers the exposed silicon surfaces.

5. The method of claim 2, wherein the vertical device is a vertical bipolar transistor and the buried doped region is a buried subcollector of the vertical bipolar transistor.

6. The method of claim 2, wherein the vertical device is a vertical bipolar capacitor and the buried doped region constitutes at least part of a lower electrode of the vertical bipolar capacitor.

7. The method of claim 1, wherein the upper surface of the region of epitaxial silicon formed in the opening is planarized, particularly using chemical-mechanical polishing.

8. The method of claim 1, wherein a shallow trench isolation region surrounding the region of epitaxial silicon is formed.

9. The method of claim 8, wherein a shallow isolation region is formed in the region of epitaxial silicon simultaneously as the shallow trench isolation region surrounding the region of epitaxial silicon is formed.

10. The method of claim 9, wherein the shallow isolation regions are formed by depositing silicon oxide and planarizing the deposited silicon oxide, particularly using chemical-mechanical polishing.

11. The method of claim 1, wherein the step of forming the deep trench includes the step of removing the monocrystalline silicon layer and the insulating layer in the area around the opening by means of masking and etching, while ensuring that the steps in the SOI substrate in the opening are exposed.

12. The method of claim 11, wherein the masking and etching include the formation of a hard mask layer, patterning the hard mask layer, and etching the hard mask layer, the monocrystalline silicon layer and the insulating layer.

13. The method of claim 12, wherein the hard mask layer is a triple layer structure comprising, from bottom to top, a silicon oxide layer, a polycrystalline silicon layer, and a silicon oxide layer.

14. The method of claim 12, wherein the deep trench in the area around the opening is formed by means of etching using the patterned hard mask layer as mask.

15. The method of claim 1, wherein the deep trench in the area around the opening is formed by means of etching using a hard mask protecting other areas than the area around the opening.

16. The method of claim 15, wherein the deep trench in the area around the opening is etched to a depth of at least a few microns, and more preferably to a depth of at least 5 microns, as measured from the upper surface of the region of epitaxial silicon formed in the opening.

17. The method of claim 15, wherein the deep trench etched in the area around the opening is filled with insulating material and optionally silicon.

18. The method of claim 1, wherein the method is implemented in a BiCMOS fabrication process.

19. A method in the fabrication of a monolithically integrated vertical device on an SOI substrate, comprising the steps of:
providing an SOI substrate including, in order, a silicon bulk material, an insulating layer, and a monocrystalline silicon layer,
forming, for the vertical device, an opening in the SOI substrate, the opening extending into the silicon bulk material,
forming silicon oxide on exposed silicon surfaces in the opening and subsequently performing a silicon oxide removal step that removes the formed silicon oxide and portions of the SOI substrate in the opening,
forming a vertical device region of epitaxial silicon in the opening and extending to a void created by the removed portions of the SOI substrate,
forming a trench in an area around the opening, including removing epitaxial silicon from at least a part of the void, and
forming the vertical device in the vertical device region.

20. The method of claim 19, wherein a buried doped region is formed in the silicon bulk material at the bottom of the opening prior to the formation of the region of epitaxial silicon in the opening.

21. A method in the fabrication of a monolithically integrated vertical device on an SOI substrate, comprising the steps of:
providing an SOI substrate comprising, from bottom to top, a silicon bulk material, an insulating layer, and a monocrystalline silicon layer,
forming, for the vertical device, an opening in the SOI substrate, the opening extending into the silicon bulk material,
forming silicon oxide on exposed silicon surfaces in the opening and subsequently removing the formed silicon oxide, whereby steps in the SOI substrate in the opening are formed,
forming a region of epitaxial silicon in the opening, and
forming a deep trench in an area around the opening, whereby the steps in the SOT substrate in the opening are removed,
wherein the step of forming the deep trench includes the step of removing the monocrystalline silicon layer and the insulating layer in the area around the opening by means of masking and etching, while ensuring that the steps in the SOI substrate in the opening are exposed,
wherein the masking and etching include the formation of a hard mask layer, patterning the hard mask layer, and etching the hard mask layer, the mono crystalline silicon layer and the insulating layer, and
wherein the hard mask layer is a triple layer structure comprising, from bottom to top, a silicon oxide layer, a polycrystalline silicon layer, and a silicon oxide layer.

* * * * *

UNITED STATES PATENT AND TRADEMARK OFFICE
CERTIFICATE OF CORRECTION

| | |
|---|---|
| PATENT NO. | : 7,618,865 B2 |
| APPLICATION NO. | : 11/217105 |
| DATED | : November 17, 2009 |
| INVENTOR(S) | : Johansson et al. |

It is certified that error appears in the above-identified patent and that said Letters Patent is hereby corrected as shown below:

Col. 6, Replace "SOT" in claim 1, lines 43, 45, 53 and 58 with --SOI--.

Col. 8, Replace "SOT" in claim 21, line 40 with --SOI--.

Signed and Sealed this

Nineteenth Day of October, 2010

David J. Kappos
*Director of the United States Patent and Trademark Office*